(12) United States Patent
Liang et al.

(10) Patent No.: US 10,277,051 B2
(45) Date of Patent: Apr. 30, 2019

(54) ELECTRONIC DEVICE, BATTERY MODULE AND CHARGING AND DISCHARGING METHOD

(71) Applicant: INDUSTRIAL TECHNOLOGY RESEARCH INSTITUTE, Hsinchu (TW)

(72) Inventors: Shih-Hao Liang, New Taipei (TW); Shou-Hung Ling, Taipei (TW); Tzi-Cker Chiueh, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 213 days.

(21) Appl. No.: 15/379,367

(22) Filed: Dec. 14, 2016

(65) Prior Publication Data

US 2018/0123371 A1    May 3, 2018

(30) Foreign Application Priority Data

Oct. 28, 2016   (TW) .............................. 105135178 A (51) Int. Cl.
*H02J 7/00* (2006.01)
*G01R 31/389* (2019.01)
(Continued)

(52) U.S. Cl.
CPC .......... *H02J 7/0068* (2013.01); *G01R 31/389* (2019.01); *H01M 10/425* (2013.01);
(Continued)

(58) Field of Classification Search
CPC ...... H02J 7/04; H01M 10/446; G01R 31/3662
(Continued)

(56) References Cited

U.S. PATENT DOCUMENTS

| 4,736,150 A | 4/1988 | Wagner |
| 6,040,684 A | 3/2000 | Mitchell |

(Continued)

FOREIGN PATENT DOCUMENTS

| CN | 1215596 A | 7/2003 |
| CN | 104155611 A | 11/2014 |

(Continued)

OTHER PUBLICATIONS

Julien, Christian M., et al. "Comparative issues of cathode materials for Li-ion batteries." Inorganics 2.1 (2014): 132-154.
(Continued)

*Primary Examiner* — Edward Tso
*Assistant Examiner* — Aaron Piggush
(74) *Attorney, Agent, or Firm* — Maschoff Brennan (57) ABSTRACT

A battery module includes a crystal lattice type battery, a detection circuit, a control circuit and an excitation circuit. The detection circuit is electrically coupled to the battery. The control circuit is electrically coupled to the detection circuit. The excitation circuit is electrically coupled to the control circuit and the battery. When the battery is charged or discharged, the detection circuit is configured to detect an impedance of the battery. The control circuit is configured to compare the impedance and a threshold. And the control circuit is configured to produce a control signal. The excitation circuit is configured to selectively provide an excitation signal to the battery according to the control signal.

22 Claims, 6 Drawing Sheets

(51) Int. Cl.
*H01M 10/42* (2006.01)
*H01M 10/44* (2006.01)
*H01M 10/46* (2006.01)
*H01M 10/48* (2006.01)
*H02J 7/04* (2006.01)

(52) U.S. Cl.
CPC ......... *H01M 10/446* (2013.01); *H01M 10/46* (2013.01); *H01M 10/48* (2013.01); *H02J 7/007* (2013.01); *H02J 7/0057* (2013.01); *H02J 7/04* (2013.01)

(58) Field of Classification Search
USPC .......................... 320/134, 139, 141, 145, 158
See application file for complete search history.

(56) References Cited

U.S. PATENT DOCUMENTS

| | | | |
|---|---|---|---|
| 8,679,680 | B2 | 3/2014 | Vanimisetti et al. |
| 8,754,611 | B2 | 6/2014 | Greening et al. |
| 8,823,325 | B2 | 9/2014 | Ling et al. |
| 8,907,675 | B2 | 12/2014 | Phlippoteau et al. |
| 8,965,722 | B2 | 2/2015 | Yoshida et al. |
| 9,153,846 | B2 | 10/2015 | Liang et al. |
| 9,229,510 | B2 | 1/2016 | Chiueh et al. |
| 2004/0128089 | A1 | 7/2004 | Barsoukov et al. |
| 2007/0244648 | A1 | 10/2007 | Chen |
| 2010/0117604 | A1* | 5/2010 | Zeier ............... H01M 10/06 320/166 |
| 2010/0164430 | A1 | 7/2010 | Lu et al. |
| 2012/0078552 | A1 | 3/2012 | Mingant et al. |
| 2013/0224579 | A1* | 8/2013 | Berrang ............... H01M 4/14 429/204 |
| 2014/0042977 | A1 | 2/2014 | Kim |
| 2014/0184172 | A1 | 7/2014 | Momo et al. |
| 2014/0320067 | A1 | 10/2014 | Ling et al. |
| 2015/0022160 | A1 | 1/2015 | Greening et al. |
| 2016/0134146 | A1 | 5/2016 | Ling et al. |
| 2016/0164315 | A1 | 6/2016 | Hsu et al. |

FOREIGN PATENT DOCUMENTS

| | | |
|---|---|---|
| CN | 104779418 A | 7/2015 |
| EP | 2 778 701 A1 | 9/2014 |
| EP | 3 018 753 A1 | 5/2016 |
| EP | 3018753 A1 | 5/2016 |
| TW | 200925266 A | 6/2009 |
| TW | M433015 U1 | 7/2012 |
| TW | I523297 B | 2/2016 |
| TW | I533489 B | 5/2016 |
| TW | M527927 U | 9/2016 |
| WO | 2014143444 A1 | 9/2014 |

OTHER PUBLICATIONS

Chen, Liang-Rui, et al. "Design of sinusoidal current charger with optimal frequency tracker for Li-ion battery." Power Electronics Conference (IPEC), 2010 International. IEEE, 2010.

Song, Yicheng, et al. "Diffusion induced stresses in cylindrical lithium-ion batteries: Analytical solutions and design insights." Journal of The Electrochemical Society 159.12 (2012): A2060-A2068.

Meng, Ying Shirley, and M. Elena Arroyo-de Dompablo. "First principles computational materials design for energy storage materials in lithium ion batteries." Energy & Environmental Science 2.6 (2009): 589-609.

Balke, N., et al. "Nanoscale mapping of ion diffusion in a lithium-ion battery cathode." Nature Nanotechnology 5.10 (2010): 749-754.

Lin, Feng, et al. "Surface reconstruction and chemical evolution of stoichiometric layered cathode materials for lithium-ion batteries." Nature communications 5 (2014).

TW Office Action dated Jul. 28, 2017 as received in Application No. 105135178.

Extended European Search Report dated Apr. 12, 2017 as received in Application No. 16205133.8.

EP Office Action in application No. 16 205 133.8 dated Dec. 12, 2018.

* cited by examiner

ELECTRONIC DEVICE, BATTERY MODULE AND CHARGING AND DISCHARGING METHOD

CROSS-REFERENCE TO RELATED APPLICATIONS

This non-provisional application claims priority under 35 U.S.C. § 119(a) on Patent Application No(s). 105135178 filed in Taiwan, R.O.C. on Oct. 28, 2016, the entire contents of which are hereby incorporated by reference.

TECHNICAL FIELD

The disclosure relates to an electronic device, a battery module and a charging and discharging method.

BACKGROUND

In order to carry electronic products, the current electronic products generally equipped with batteries so that the electronic products could be charged via the batteries at anytime and any place. For the environmental protection and the practicability, rechargeable batteries become the mainstream in the current market. There is a variety of rechargeable batteries depending on different materials used. Batteries with crystal lattice type are widely used on a variety of electronic products.

When batteries with crystal lattice type started to be used, parts of crystal lattices in the electrodes may be occupied by conductive ions or parts of crystal lattices are embedded with conductive ions even though the batteries are used normally. This situation will hinder other ions moving to the other crystal lattices of the electrodes and decrease the efficiency of ion diffusivity. If the situation remains for a period of time, the crystal lattices may even collapse. As a result, the storage capacity irreversibly decreases and the lifetimes of batteries are decrease.

SUMMARY

A charging and discharging method is disclosed according to one embodiment of the present disclosure. In the charging and discharging method, an impedance of a crystal lattice type battery is detected when the crystal lattice type battery is charged or discharged. An excitation signal is provided to the crystal lattice type battery when the impedance is greater than or equal to a threshold.

A battery module is disclosed according to one embodiment of the present disclosure. The battery module includes a crystal lattice type battery, a detection circuit, a control circuit and an excitation circuit. The detection circuit is electrically coupled to the crystal lattice type battery. The control circuit is electrically coupled to the detection circuit. The excitation circuit is electrically coupled to the control circuit and the crystal lattice type battery. When the crystal lattice type battery is charged or discharged, the detection circuit is configured to detect the impedance of the crystal lattice type battery. The control circuit is configured to compare the impedance to the threshold and generate a control signal. The excitation circuit is configured to provide an excitation signal to the crystal lattice type battery according to the control signal.

An electronic device is disclosed according to one embodiment of the present disclosure. The electronic device is adapted to provide power via a crystal lattice type battery. The electronic device has a control circuit and an excitation circuit. The excitation circuit is electrically coupled to the control circuit and the crystal lattice type battery. The control circuit is configured to compare the impedance to the threshold and generate a control signal. The excitation circuit is configured to provide an excitation signal to the crystal lattice type battery according to the control signal.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
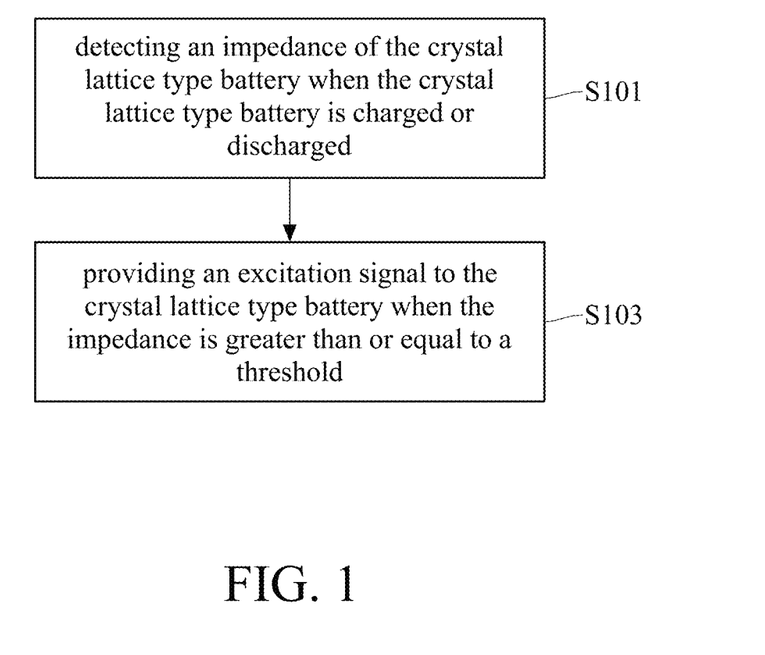
FIG. 1 is a flow chart of charging and discharging method according to one embodiment of the present disclosure.

Please refer to FIG. 1, which is a flow chart of charging and discharging method according to one embodiment of the present disclosure. As shown in FIG. 1, in step S101 of the charging and discharging method, an impedance of a crystal lattice type battery is detected when the crystal lattice type battery is charged or discharged. In step S103, when the impedance is greater than or equal to a threshold, an excitation signal is provided to the crystal lattice type battery. In this embodiment, the crystal lattice type battery is a battery installed with a positive plate or negative plate using crystal lattices.

Figure 2:
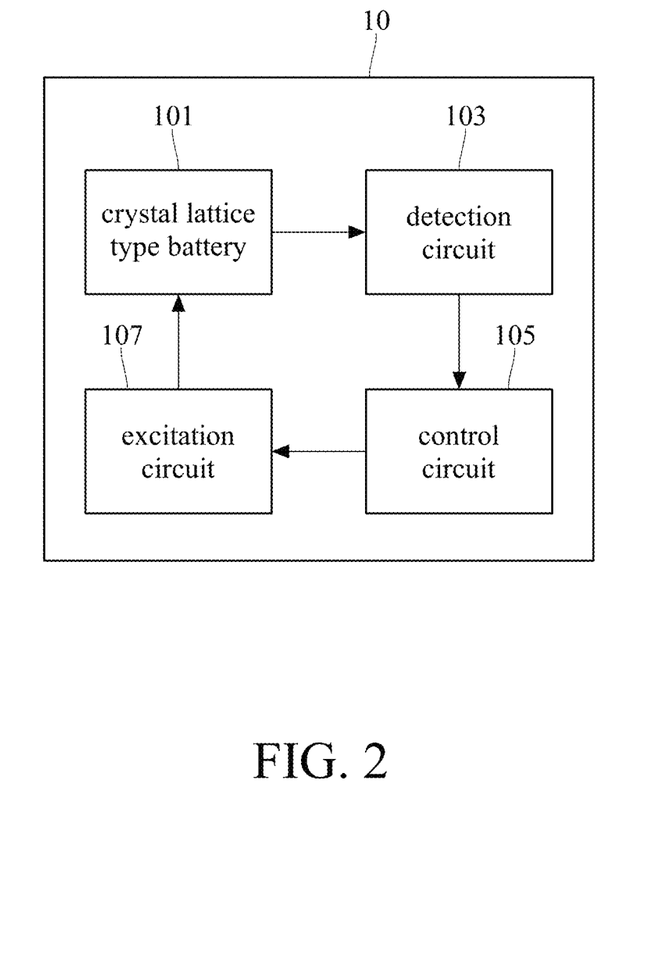
FIG. 2 is a block diagram of a battery module according to one embodiment of the present disclosure.

Please refer to FIG. 2 for further explanation. FIG. 2 is a block diagram of a battery module according to one embodiment of the present disclosure. As shown in FIG. 2, a battery module 10 has a crystal lattice type battery 101, a detection circuit 103, a control circuit 105 and an excitation circuit 107. The crystal lattice type battery 101 is electrically coupled to the detection circuit 103 and the excitation circuit 107. The control circuit 105 is electrically coupled to the detection circuit 103 and the excitation circuit 107.

In one embodiment, the positive electrode and the negative electrode of the crystal lattice type battery 101 have the structures of crystal lattices. A colloidal polymer or a solid polymer between the positive electrode and the negative electrode are used as a medium for ion transmission. In one example, the crystal lattice type battery 101 is a lithium-ion polymer battery. More specifically, in another example, the crystal lattice type battery 101 is a lithium-cobalt battery, a nickel-lithium battery, a lithium-nickel-cobalt battery, a lithium iron phosphate battery or a lithium-manganese battery. The batteries mentioned above are just for illustration and the present disclosure is not limited to the above examples.

When the crystal lattice type battery 101 is charged or discharged, the detection circuit 103 is configured to detect the impedance of the crystal lattice type battery 101. In one example, the impedance is selected from at least one of groups consisting of DC impedance, AC impedance, Reduction-Oxidation impedance and diffusion impedance. The present disclosure is not limited to the methods of detecting the impedance of the crystal lattice type battery 101 in the above embodiment. In one example, the detection circuit 103 is a micro control unit (MCU), an application-specific integrated circuit, a field-programmable gate array (FPGA) or another type of integrated circuit. In one embodiment, the detection circuit 103 is a chip called "BQ76920", "BQ76930" or "BQ76940" manufactured by Texas Instrument. Persons having ordinary skills in the art are able to determine what kind of impedance is detected, how the impedance is detected or what kind of structure is provided for the impedance detection according to actual demands after carefully reading the present disclosure. The present disclosure is not limited to the above embodiments and examples.

The control circuit 105 is configured to compare the detected impedance to a threshold and generate a control signal. In one embodiment, when the control circuit 105 determines that the detected impedance is greater than or equal to the threshold, the control circuit 105 generates the control signal. In one example, the threshold is a predetermined magnification of a minimum impedance of the crystal lattice type battery 101. In one embodiment, the threshold is 1.1 times the impedance of the crystal lattice type battery 101, but the present disclosure is not limited to the embodiment. In one example, the minimum impedance is determined via real-time impedance detected in the process of use. In one embodiment, the detection circuit 103 will provide the detected impedance value to the control circuit 105. The control circuit 105 will record part of the impedance values. Theoretically, when the crystal lattice type battery 101 starts to be discharged, the impedance of the crystal lattice type battery 101 will decrease first and then increase. Therefore when the control circuit 105 determines that the impedance of the crystal lattice type battery 101 starts to increase, the control circuit 105 will determine that the initial value of the impedance or other impedance value similar to the initial value is the minimum impedance value. In other words, in this embodiment, when the minimum impedance value of the battery module 10 changes, the aforementioned threshold will change with the real-time minimum impedance value of the battery module 10. In another embodiment, the minimum impedance value is a default constant value of the battery module 10. The constant value is 1.1 times the default minimum value of the battery module 10. In one example, the control circuit 105 is a micro control unit (MCU), an application-specific integrated circuit, a field-programmable gate array (FPGA) or another type of integrated circuit.

The excitation circuit 107 is configured to selectively provide the excitation signal to the crystal lattice type battery 101 according to the control signal. In one example, the excitation signal has an excitation frequency, and the value of the excitation frequency is substantially equal to the natural frequency of the crystal lattice type battery 101. In one embodiment, the excitation frequency is less than or equal to 500 Kilohertz (kHz), and the excitation frequency is greater than or equal to 300 kHz. In another embodiment, the excitation frequency is less than or equal to 410 kHz and the excitation frequency is greater than or equal to 350 kHz. In some examples, the waveform of the excitation signal is a square wave, a sine wave or a triangular wave.

Figure 3:
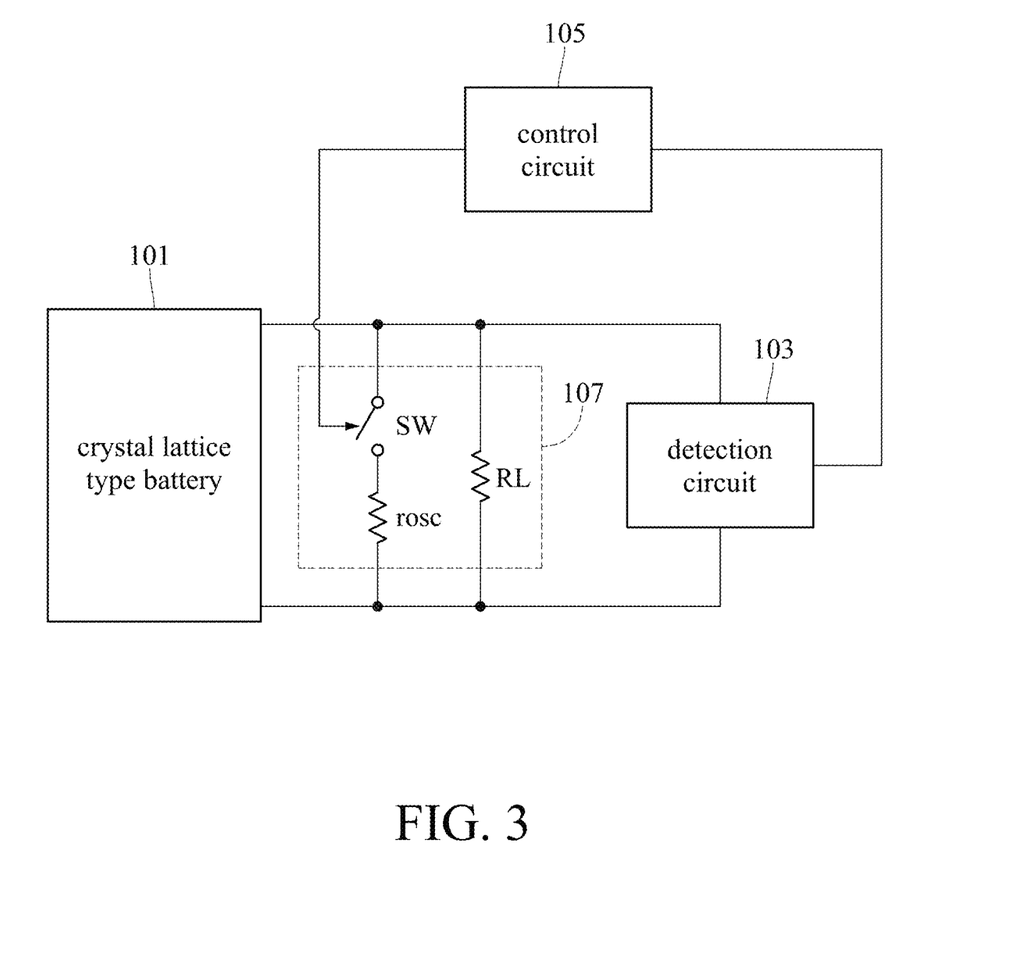
FIG. 3 is a schematic diagram of the excitation circuit according to one embodiment of the present disclosure.

Please refer to FIG. 3 for illustrating the embodiment of the excitation circuit 107. FIG. 3 is a schematic diagram of the excitation circuit according to one embodiment of the present disclosure. The excitation circuit 107 has a load resistor RL, a load resistor rocs and a switch unit SW. The switch unit SW is connected to the load resistor rocs in series, and the switch unit SW and load resistor rocs connected in series are connected to the load resistor RL in parallel. The switch unit SW and the load resistor rocs connected in series are connected to the crystal lattice type battery 101 in parallel. The load resistor RL is connected to the crystal lattice type battery 101 in parallel. On the other hand, the switch unit SW is electrically connected to the control circuit 105. The switch unit SW is controlled by the control signal so that the switch unit SW is selectively turned on. In one embodiment, when the control circuit 105 determines the detected impedance is greater than or equal to the threshold, the switch unit SW repeatedly turned on and off according to the control signal.

The impedance of the crystal lattice type battery 101 changes with on-state or off-state of the switch unit SW. As a result, the current output from the crystal lattice type battery 101 also changes. From another perspective, when the switch unit SW is turned on and off repeatedly, the output current value of the crystal lattice type battery 101 is no longer a constant value. Instead, the output current of the crystal lattice type battery 101 will change with on-state or off-state of the switch unit SW. It is equivalent to provide an excitation signal to the crystal lattice type battery 101. The oscillation is periodic or non-periodic. When the excitation signal is provided to the crystal lattice type battery 101, the inner conductive medium within the crystal lattice type battery 101 will have an excitation correspondingly. The inner excitation within the crystal lattice type battery 101 is related to the structural oscillation or variation of the electromotive force and not repeated herein. At this time, at least part of ions embedded in the crystal lattices will be separated from the crystal lattices of the electrodes based on the excitation, and will not hinder other ions moving toward other crystal lattices of the electrodes. As a result, diffusion of the ions can be more uniformly spread over the electrodes and will be no local ion concentration higher phenomenon.

The resistance of the load resistor rocs is much greater than the resistance of the load resistor RL. Persons having ordinary skills in the art are familiar with the definition of the terms "much greater", so not repeated herein. In one embodiment, the resistance of the load resistor rocs is 10 times more than the resistance of the load resistor RL.

In addition to the embodiment of the excitation circuit 107 shown in FIG. 3, any excitation circuit capable of making the output voltage or the output current of crystal lattice type battery 101 have the excitation will be within the scope of the present disclosure. In one embodiment, the excitation circuit is an element having a capacitor or an inductor used for energy storage. In this kind of embodiment, the excitation circuit equivalently has a harmonic oscillator circuit. The output voltage or the output current of the crystal lattice type battery 101 become variable through the harmonic oscillator circuit so that the excitation signal is provided to the crystal lattice type battery 101. The present disclosure is not limited to the capacity, the inductance, the quantity or the connections shown in the above embodiment. In one embodiment, the excitation circuit has an inductor and a switch unit. The switch unit is selectively turned on according to the control signal. When the switch unit is turned on, the inductor is electrically coupled to the crystal lattice type battery. In other words, when the switch unit is turned on, the crystal lattice type battery charges the inductor. When the switch unit is turned off, the inductor is discharged via other current paths. In one example, the current paths include the crystal lattice type battery. In another example, the current path does not include the crystal lattice type battery. Thereby, the output current of the crystal lattice type battery is changed so that an excitation signal is equivalently provided to the crystal lattice type battery. The above embodiments are just for illustrating, and the present disclosure is not limited to the above embodiments.

In another embodiment, the excitation circuit has a boost converter, a buck converter or a buck-boost converter so that the output voltage or the output current of the crystal lattice type battery 101 could be changed. The present disclosure is not limed to the parameters and the connections of the boost converter, the buck converter or the buck-boost converter mentioned in the above embodiment.

Figure 4:
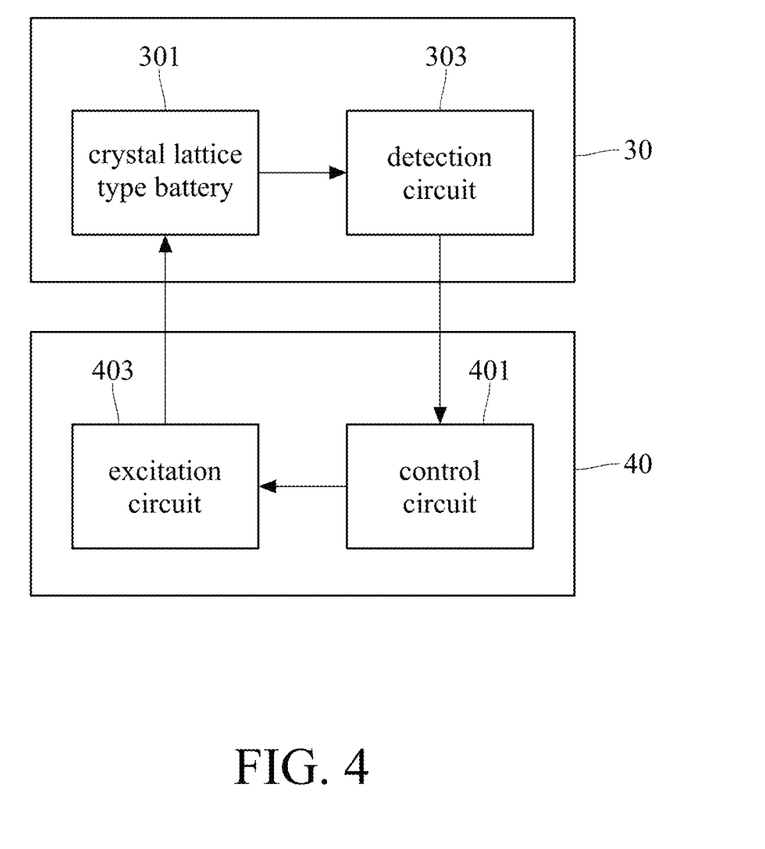
FIG. 4 is a block diagram of an electronic device according to one embodiment of the present disclosure.

In addition to the aforementioned battery module, the present disclosure further provides an electronic device. Please refer to FIG. 4 for explanation. FIG. 4 is a block diagram of an electronic device according to one embodiment of the present disclosure. The electronic device 40 is adapted to provide power via the crystal lattice type battery 301. The electronic device 40 and the battery module 30 are shown in FIG. 4. In this embodiment, the electronic device 40 has a control circuit 401 and an excitation circuit 403, and the battery module 30 has a crystal lattice type battery 301 and a detection circuit 303. The relevant structures and operations regarding the crystal lattice type battery 301, the detection circuit 303, the control circuit 401 and the excitation circuit 403 are similar to the structures and operations regarding the crystal lattice type battery 101, the detection circuit 103, the control circuit 105 and the excitation circuit 107. In other words, in this embodiment, although the control circuit 401 and the excitation circuit 403 are set in the electronic device 40, persons having ordinary skills in the art are able to obtain the operations of the electronic device 40 and the battery module 30 according to aforementioned descriptions. The related details are not repeated.

Figure 5:
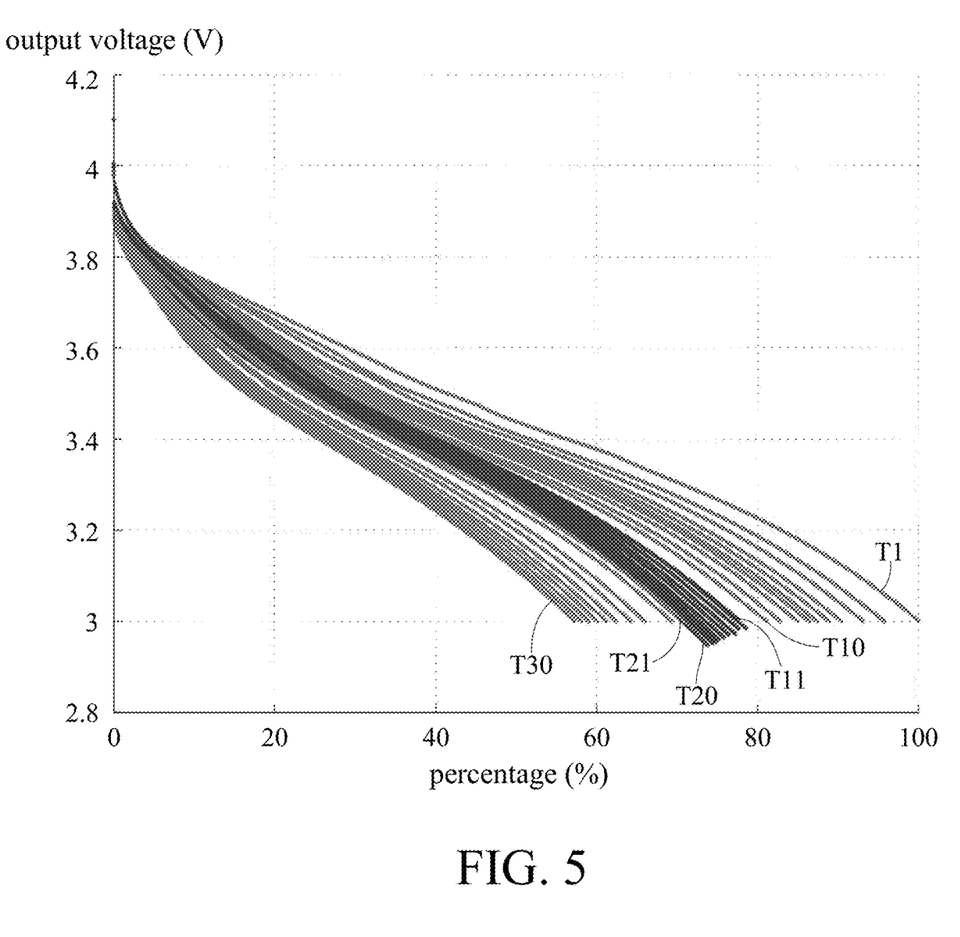
FIG. 5 is schematic diagram of the storage capacity of a battery module corresponding to number of times of discharge according to one embodiment of the present disclosure.

Please refer FIG. 5, which is schematic diagram of the storage capacity of a battery module corresponding to number of times of discharge according to one embodiment of the present disclosure. FIG. 5 represents the experimental result that a lithium battery (LIR2032) is charged and discharged for several times. The horizontal axis of FIG. 5 represents a ratio of the discharge to the maximum storage capacity and the unit is percentage. The vertical axis represents the output voltage and the unit is volt (V). There are 30 discharge curves shown in FIG. 5, and each of discharge curves respectively represents the first discharge to the thirtieth discharge. Every time the crystal lattice type battery has been discharged, the crystal lattice type battery of the battery module will be charged to the maximum storage capacity at that time. Each of the discharge curves represents the variation of discharge when the output voltage of the battery decreases to 3 volt. For simplified, only discharge curve T1, T10, T11, T20, T21 and T30 are labeled in FIG. 5. However, there are still discharge curve T2-T9 between the discharge curve T1 and the discharge curve T10. There are still discharge curve T12-T19 between the discharge curve T11 and the discharge curve T20. There are still discharge curve T22-T29 between the discharge curve T21 and the discharge curve T30. The numbers shown in the reference signs of the discharge curves represent the sequence numbers of discharges. For example, the discharge curve T1 represents the first discharge, and the discharge curve T11 the eleventh discharge and so on.

More specifically, the discharge curve T1 to the discharge curve T10 are created without using the aforementioned charging and discharging method. In other words, the discharge curve T1 to the discharge curve T10 represents the discharge conditions that the excitation signal is not provided to the crystal lattice type battery. The discharge curve T11 to the discharge curve T20 are created using the aforementioned charging and discharging method. In other words, the discharge curve T11 to the discharge curve T20 represents the discharge conditions that the excitation signal is provided to the crystal lattice type battery. The discharge curve T21 to the discharge curve T30 are created without using the aforementioned charging and discharging method. In other words, the discharge curve T21 to the discharge curve T30 represents the discharge conditions that the excitation signal is not provided to the crystal lattice type battery.

As shown in FIG. 5, with the increase of the number of times of discharges, the initial output voltage of the battery module decreases gradually until the output voltage reaches 3 volt. The discharge of the battery module also decreases gradually in each time. As shown in FIG. 5, those curves from the discharge curve T11 to the discharge curve T20 are more concentrated than those curves from the discharge curve T1 to the discharge curve T10, and those curves from the discharge curve T21 to the discharge curve T30. The decay rate of the lithium battery (LIR2032) of the discharge curve T1 to the discharge curve T10 is about 19%. The decay rate of the lithium battery (LIR2032) of the discharge curve T11 to the discharge curve T20 is about 7.4%. The decay rate of the lithium battery (LIR2032) of the discharge curve T21 to the discharge curve T30 is about 13.6%. In other words, the output voltage and the discharge (or storage capacity) of the battery module in the condition that the aforementioned charging and discharging method is used is decreased less than in the condition that the aforementioned charging and discharging method is not used. In other words, when the aforementioned charging and discharging method is used, the ageing process of the battery module slows down and the lifetime of the battery module is extended.

Figure 6:
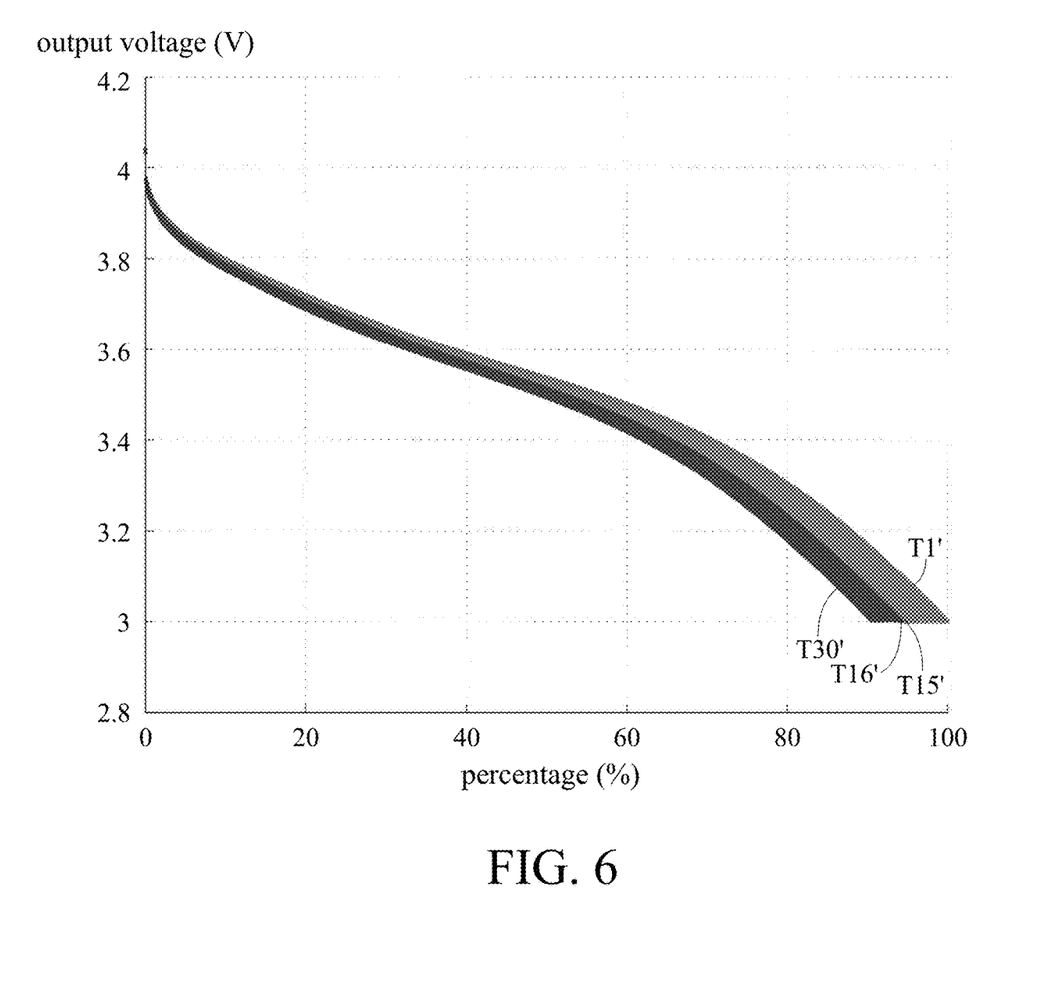
FIG. 6 is a schematic diagram of the storage capacity of a battery module corresponding to number of times of discharge according to anther embodiment of the present disclosure.

Please refer to FIG. 6, which is a schematic diagram of the storage capacity of a battery module corresponding to number of times of discharge according to anther embodiment of the present disclosure. FIG. 5 represents the experimental result that a lithium battery (LIR2032) is charged and discharged for several times. The reference signs shown in FIG. 6 are similar to the reference signs shown in FIG. 5, and not repeated here. The discharge curve T1' to the discharge curve T15' are created without using the aforementioned charging and discharging method. The discharge curve T16' to the discharge curve T30' are created using the aforementioned charging and discharging method. The decay rate of the lithium battery (LIR2032) of the discharge curve T1' to the discharge curve T15' is about 5.6%. The decay rate of the lithium battery (LIR2032) of the discharge curve T16' to the discharge curve T30' is about 3.8%. In the embodiment of FIG. 6, it shows that the initial output voltage and discharge of the battery module in the condition that the aforementioned charging and discharging method is used are decreased less than in the condition that the aforementioned charging and discharging method is not used.

Based on the above descriptions, in the operations of the electronic device, the battery module and the charging and discharging methods disclosed in the present disclosure, it is determined whether the impedance of the crystal lattice type battery is greater than or equal to a threshold when the crystal lattice type battery is charged and discharged, so that it is determined whether the electrodes of the crystal lattice type battery are embedded conductive ions to affect the efficiency of charge and discharge and the storage capacity of the crystal lattice type battery. When it is determined that the impedance is greater than or equal to the threshold, the excitation signal is properly provided to the crystal lattice type battery so that part of ions embedded in the crystal lattices could be separated from the crystal lattices. In one example, the excitation signal has the excitation frequency similar to the natural frequency of the battery. Thereby, the lifetime of the battery is extended and the durability of the battery is increased.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A battery module, comprising:
   a crystal lattice type battery;
   a detection circuit electrically coupled to the crystal lattice type battery and configured to detect an impedance of the crystal lattice type battery when the crystal lattice type battery is undergoing a process of being charged or discharged;
   a control circuit electrically coupled to the detection circuit and configured to compare the impedance to a threshold, with the threshold comprising a predetermined magnification of a minimum value of the impedance determined based on a real-time detection and the threshold varying with the minimum value of the impedance, and the control circuit configured to generate a control signal when the impedance is greater than or equal to the threshold; and
   an excitation circuit electrically coupled to the control circuit and the crystal lattice type battery and configured to provide an excitation signal to the crystal lattice type battery according to the control signal.

2. The battery module according to claim 1, wherein the excitation signal has an excitation frequency substantially equal to a natural frequency of the battery.

3. The battery module according to claim 2, wherein the excitation frequency is less than or equal to 500 kilohertz (kHz) and greater than or equal to 300 kilohertz (kHz).

4. The battery module according to claim 3, wherein the excitation frequency is less than or equal to 410 kilohertz (kHz) and greater than or equal to 350 kilohertz (kHz).

5. The battery module according to claim 1, wherein the excitation circuit has a switch unit and a load, the switch unit is connected to the load in series, the switch unit and the load connected in series are connected to the crystal lattice type battery in parallel, and the switch unit is configured to be turned on and off repeatedly based on an excitation frequency according to the control signal.

6. The battery module according to claim 1, wherein the excitation circuit has an inductor and a switch unit, the switch unit is selectively turned on according to the control signal, and the inductor is electrically coupled to the crystal lattice type battery when the switch unit is turned on.

7. The battery module according to claim 1, wherein the threshold is 1.1 times a minimum value of the impedance.

8. The battery module according to claim 1, wherein the impedance is selected from at least one of groups consisting of a DC impedance, an AC impedance, a Reduction-Oxidation impedance and a diffusion impedance.

9. An electronic device adapted to provide power via a crystal lattice type battery, comprising:
   a control circuit configured to compare an impedance of the crystal lattice type battery to a threshold, with the threshold comprising a predetermined magnification of a minimum value of the impedance determined based on a real-time detection and the threshold varying with the minimum value of the impedance, and the control circuit configured to generate a control signal when the impedance is greater than or equal to the threshold; and
   an excitation circuit electrically coupled to the control circuit and the crystal lattice type battery and configured to provide an excitation signal to the crystal lattice type battery according to the control signal.

10. The electronic device according to claim 9, wherein the excitation signal has an excitation frequency substantially equal to a natural frequency of the battery.

11. The electronic device according to claim 10, wherein the excitation frequency is less than or equal to 500 kilohertz (kHz) and greater than or equal to 300 kilohertz (kHz).

12. The electronic device according to claim 11, wherein the excitation frequency is less than or equal to 410 kilohertz (kHz) and greater than or equal to 350 kilohertz (kHz).

13. The electronic device according to claim 9, wherein the excitation circuit has a switch unit and a load, the switch unit is connected to the load in series, the switch unit and the load connected in series are connected to the crystal lattice type battery in parallel, and the switch unit is configured to be turned on and off repeatedly based on an excitation frequency according to the control signal.

14. The electronic device according to claim 9, wherein the excitation circuit has an inductor and a switch unit, the switch unit is selectively turned on according to the control signal, and the inductor is electrically coupled to the crystal lattice type battery when the switch unit is turned on.

15. The electronic device according to claim 9, wherein the threshold is 1.1 times a minimum value of the impedance.

16. The electronic device according to claim 9, wherein the impedance is selected from at least one of groups consisting of a DC impedance, an AC impedance, a Reduction-Oxidation impedance and a diffusion impedance.

17. A charging and discharging method, comprising:
   detecting an impedance of a crystal lattice type battery when the crystal lattice type battery is undergoing a process of being charged or discharged; and
   providing an excitation signal to the crystal lattice type battery when the impedance is greater than or equal to a threshold, with the threshold comprising a predetermined magnification of a minimum value of the impedance determined based on a real-time detection and the threshold varying with the minimum value of the impedance.

18. The charging and discharging method according to claim 17, wherein the excitation signal has an excitation frequency substantially equal to a natural frequency of the battery.

19. The charging and discharging method according to claim 18, wherein the excitation frequency is less than or equal to 500 kilohertz (kHz) and greater than or equal to 300 kilohertz (kHz).

20. The charging and discharging method according to claim 19, wherein the excitation frequency is less than or equal to 410 kilohertz (kHz) and greater than or equal to 350 kilohertz (kHz).

21. The charging and discharging method according to claim 17, wherein the threshold is 1.1 times a minimum value of the impedance.

22. The charging and discharging method according to claim 17, wherein the impedance is selected from at least one of groups consisting of a DC impedance, an AC impedance, a Reduction-Oxidation impedance and a diffusion impedance.

* * * * *